(12) United States Patent
Marcelynas et al.

(10) Patent No.: US 10,784,142 B2
(45) Date of Patent: Sep. 22, 2020

(54) LIFT PIN SYSTEM FOR WAFER HANDLING

(71) Applicant: Varian Semiconductor Equipment Associates, Inc., Gloucester, MA (US)

(72) Inventors: Stacia Marcelynas, Gloucester, MA (US); Riordan Cayabyab, Gloucester, MA (US); Jonathan D. Fischer, Lynn, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 245 days.

(21) Appl. No.: 15/938,239

(22) Filed: Mar. 28, 2018

(65) Prior Publication Data

US 2019/0214290 A1 Jul. 11, 2019

Related U.S. Application Data

(60) Provisional application No. 62/615,211, filed on Jan. 9, 2018.

(51) Int. Cl.
*B23Q 3/00* (2006.01)
*H01L 21/687* (2006.01)

(52) U.S. Cl.
CPC .............. *H01L 21/68742* (2013.01)

(58) Field of Classification Search
USPC ............. 269/13, 74; 118/724, 728, 729
See application file for complete search history.

(56) References Cited

U.S. PATENT DOCUMENTS

| 5,669,977 | A | 9/1997 | Shufflebotham et al. |
| 5,684,669 | A | 11/1997 | Collins et al. |
| 6,435,798 | B1 * | 8/2002 | Satoh .................. C23C 16/4586 118/728 |
| 10,535,549 | B2 * | 1/2020 | Nguyen ............ H01L 21/68742 |
| 2006/0156981 | A1 * | 7/2006 | Fondurulia ......... C23C 16/4583 118/715 |
| 2009/0314211 | A1 * | 12/2009 | Du Bois ........... H01L 21/68742 118/729 |
| 2010/0101491 | A1 | 4/2010 | Aida |

FOREIGN PATENT DOCUMENTS

| EP | 0783175 A2 | 9/1997 | |
| JP | 2017-228696 A | 12/2017 | |
| KR | 100526924 | * 11/2002 | ............. H01L 21/68 |
| KR | 10-0526924 B1 | 11/2005 | |
| KR | 10-0854802 B1 | 8/2008 | |
| KR | 10-1235623 B1 | 2/2013 | |

* cited by examiner

*Primary Examiner* — Joseph J Hail
*Assistant Examiner* — Shantese L McDonald

(57) ABSTRACT

A lift pin system and a lift pin assembly are disclosed. In one or more approaches, a lift pin system includes a wafer support, such as an electrostatic chuck or a platen, and a lift pin assembly coupled to the wafer support. The lift pin assembly may include a plurality of pins. Each of the plurality of pins may include a tip extending through a housing, a spring within the housing, wherein the spring biases against the tip, and a support arm coupled to the housing. In some approaches, the housing is threadably coupled with the support arm to allow access to the tip of each pin above a top surface of the wafer support for easy replacement. The replaceable pin tips further permit easier customization of pin tip geometries, materials, spring force, etc., depending on specific process and/or wafer characteristics.

17 Claims, 8 Drawing Sheets

LIFT PIN SYSTEM FOR WAFER HANDLING

This application claims priority to U.S. Provisional Patent Application No. 62/615,211 filed Jan. 9, 2018, entitled "Lift Pin System for Wafer Handling," and incorporated by reference herein in its entirety.

FIELD OF THE DISCLOSURE

Embodiments of the present disclosure relate generally to wafer handling and, more specifically, to a customized lift pin system for wafer handling.

BACKGROUND OF THE DISCLOSURE

Formation of some devices on substrates includes multiple layers of thin films deposited in a deposition chamber, such as a physical vapor deposition (PVD) chamber. In some embodiments, the substrate is rotated during the deposition process to obtain good film uniformity. Deposition of some layers may also include the substrate to be heated. Further, the deposition process includes a high vacuum pressure. An electrostatic chuck is often used to electrostatically retain a substrate on a substrate support during the deposition process. During set-up, a substrate such as a wafer, supported on three or more lift pins, is dropped down onto the protrusions or lift pins of the electrostatic chuck. The power or voltage for the electrostatic chuck is then turned on.

Current lift pin assemblies include complete removal from the process chamber for maintenance and/or replacement of one or more of the tips, thus resulting in tool downtime. Furthermore, current lift pin assemblies are not customizable, and suffer from defocusing and de-chucking issues. It is with respect to these and other deficiencies of current approaches the present disclosure is provided.

BRIEF SUMMARY

In a first embodiment, a lift pin system may include a wafer support, and a lift pin assembly coupled to the wafer support. The lift pin assembly may include a plurality of pins, each of the plurality of pins having a tip extending through a housing, the housing coupled to a support arm. Each of the plurality of pins may further include a spring within the housing, the spring biasing against the tip.

In a second embodiment, a lift pin assembly may include a support structure including a plurality of support arms extending through an electrostatic chuck, and a housing coupled to the plurality of support arms. The lift pin assembly may further include a tip extending through the housing, and a spring within the housing, wherein the spring biases against the tip.

In a third embodiment, a lift pin assembly may include a support structure including a plurality of support arms extending through an electrostatic chuck, and a housing coupled to the plurality of support arms. The lift pin assembly may further include a tip extending through the housing, wherein the tip extends above a top surface of the electrostatic chuck. The lift pin assembly may further include a spring within the housing, the spring biasing against the tip.

Figure 1:
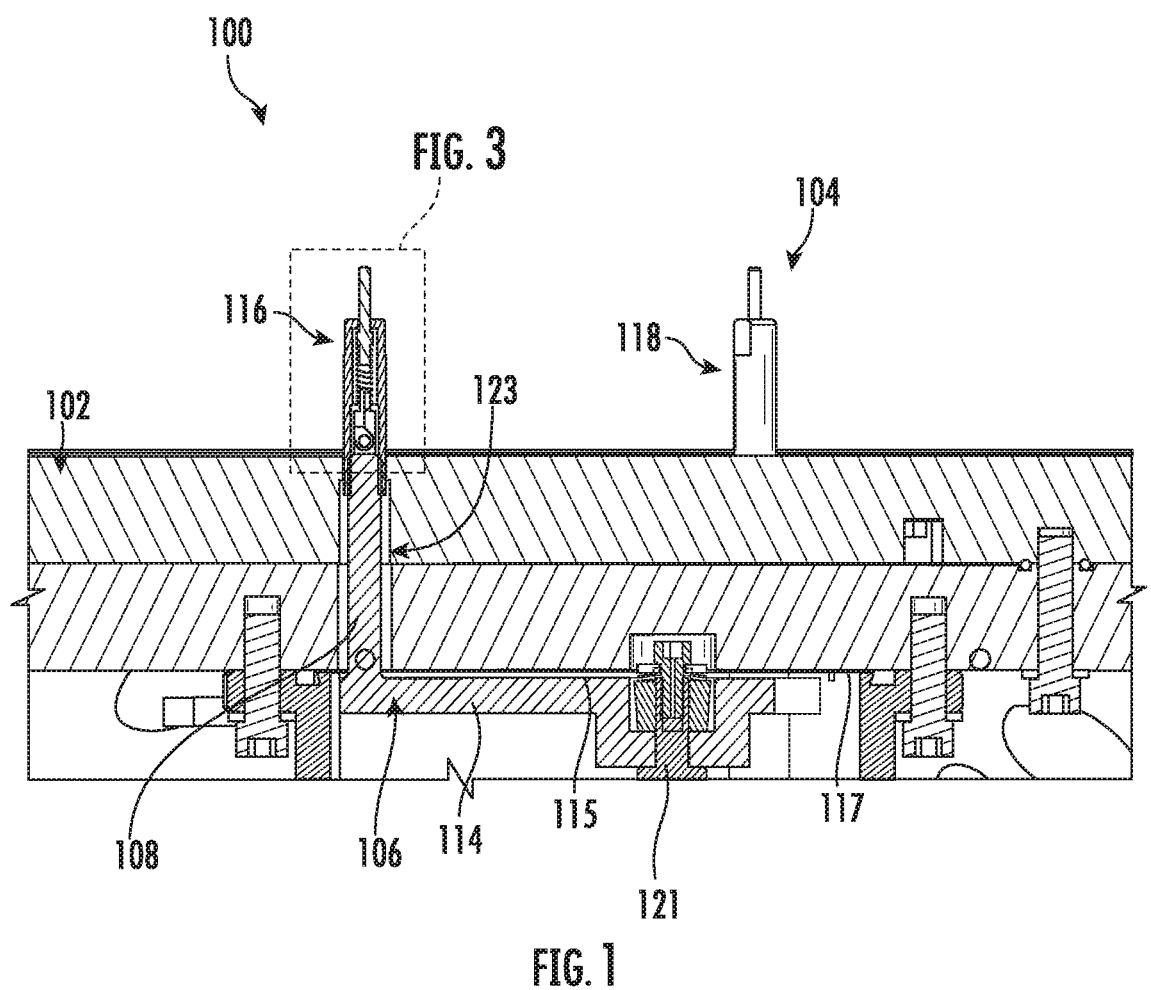
FIG. 1 shows a side cross-sectional view of a lift pin system in accordance with certain aspects of the present disclosure.

The drawings are not necessarily to scale. The drawings are merely representations, not intended to portray specific parameters of the disclosure. Furthermore, the drawings are intended to depict exemplary embodiments of the disclosure, and therefore are not considered as limiting in scope.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Various approaches in accordance with the present disclosure will now be described more fully hereinafter with reference to the accompanying drawings, where embodiments of the methods are shown. The approaches may be embodied in many different forms and are not to be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts with respect to the geometry and orientation of a component of a device as appearing in the figures. The terminology will include the words specifically mentioned, derivatives thereof, and words of similar meaning and/or significance.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "approximate" or "approximately," can be used interchangeably in some embodiments, and can be described using any relative measures acceptable by one of skill. For example, these terms can serve as a comparison to a reference parameter, to indicate a deviation still providing the intended function. Although non-limiting, the deviation from the reference parameter can be, for example, in an amount of less than 1%, less than 3%, less than 5%, less than 10%, less than 15%, less than 20%, and so on.

A lift pin system and a lift pin assembly are disclosed. In one or more approaches, a lift pin system includes an electrostatic chuck or a platen, and a lift pin assembly coupled to the electrostatic chuck or the platen. The lift pin assembly may include a plurality of pins. Each of the plurality of pins may include a tip extending through a housing, and a spring within the housing, wherein the spring biases against the tip. The plurality of pins may each include a support arm coupled to the housing. In some approaches, the housing is threadably coupled with the support arm to allow access to the tip of each pin above a top surface of the electrostatic chuck or platen for easy replacement. The replaceable tips further permit easier customization of pin tip geometries, materials, spring force, etc., depending on specific processes or wafer characteristics.

As will be described below, provided herein is a novel lift pin mechanism design for handling wafers on an electrostatic chuck (ESC). The lift pin mechanism may be a replaceable assembly spring loaded with a specific spring and lift pin tip. The lift pin tips can be made of any material weldable to a spring. The lift pin tip may be virtually any tip geometry, depending on the user, process, or purpose of the lift pin. In one non-limiting embodiment, the lift pin is triangular shaped to prevent metal on metal contact inside a housing of the lift pin to reduce particle production. The spring may provide backside force contact for electrical continuity purposes during pulsed DC bias RF plasma processes. In some approaches, the spring is laser welded to the lift pin tip to provide improved electrical continuity for DC bias, and may be mechanically clamped (e.g., by a screw) to an electrically conductive base of the lift pin tip assembly. The screw may secure the lift pin tip assembly to an electrically conductive lift pin support assembly.

During use, the screw may be accessible above the ESC surface, e.g., when the support assembly is in an 'up' position for loading/unloading of the wafer. The lift pin tip may include a housing threaded or press fitted on to the lift pin support assembly. The housing helps cover the lift pin tip from plasma line of sight, and helps guide the lift pin and spring in the intended direction.

In some approaches, the spring is mounted within the housing of the lift pin assembly. For example, a bottom tang of the spring may be mechanically clamped to a base within an interior of the housing to maintain electrical continuity and to secure the spring in place during assembly installation. In other approaches, a non-metallic pin tip may be press-fit into a weldable pin holder, the weldable pin holder being laser welded to the spring.

The lift pin tips can be customized per the tool, process and/or user by changing the pin tip geometries and material. For example, to pierce through backside insulating layers, a sharper tip may be selected. Conversely, a flatter tip may be used to avoid damaging the backside. The spring can also be customized per tool, process, and/or user, e.g., depending on how much backside force contact is intended. For example, when piercing through backside insulating layers, a larger spring force may be selected. To avoid damaging the backside of the wafer, a smaller spring force may be selected. The lift pin assembly disclosed herein is intended to work in such a way using a universal support assembly, and replaceable lift pin tips. The lift pin tips can be replaced as frequently as intended and/or to switch between processes.

In some embodiments, the tips will be accessible above the ESC/platen/surface, so there is no need to access underneath the chamber, requiring extra labor/mechanic support/tool down time. Advantageously, the tips will be able to be uninstalled and installed without removing additional parts from the chamber. The lift pin tip assemblies further enable a repeatable installation process (e.g., to avoid operator error). In one non-limiting example, tool down time may be decreased from approximately one day to approximately one hour. Embodiments of the present disclosure may also improve repeatability of spring force, for example, from a range of 0.3 lbf-1.8 lbf to 0.45 lbf to 0.55 lbf (or better).

With reference now FIGS. 1-2, a lift pin system (hereinafter "system") 100 according to embodiments of the present disclosure will be described in greater detail. As shown, the system 100 may include a wafer support 102, and a lift pin assembly 104 coupled to the wafer support 102. Although not limited to any particular type or geometry, the wafer support 102 will hereinafter be described as an electrostatic chuck. The electrostatic chuck may hold a substrate, such as a semiconductor wafer, during substrate processing in processing chambers used for various applications, such as physical vapor deposition, etching, or chemical vapor deposition. In other embodiments, the wafer support 102 may be a platen. Electrostatic chucks may include one or more electrodes embedded within a unitary chuck body including a dielectric or semi-conductive ceramic material for generating electrostatic clamping field. Semi-conductive ceramic materials, such as aluminum nitride, boron nitride, or aluminum oxide doped with a metal oxide, for example, may be used to enable Johnsen-Rahbek or non-Coulombic electrostatic clamping fields to be generated.

In a monopolar electrostatic chuck, the chuck comprises a single electrode electrically biased with respect to the substrate by an applied voltage. A plasma is introduced into the processing chamber to induce opposing electrostatic charge in the chuck and substrate to create an attractive electrostatic force for electrostatically holding the substrate to the chuck. In a bipolar electrostatic chuck, the chuck comprises two electrodes electrically biased relative to one another to provide an electrostatic force for holding the substrate to the chuck. Unlike the monopolar electrostatic chuck, the bipolar chuck does not require the presence of a plasma to generate an electrostatic clamping force.

Electrostatic chucks offer several advantages over mechanical clamping devices and vacuum chucks. For example, electrostatic chucks reduce stress-induced cracks caused by mechanical clamping, allow larger areas of the substrate to be exposed for processing (little or no edge exclusion), and can be used in low pressure or high vacuum environments. Additionally, the electrostatic chuck can hold the substrate more uniformly to the chucking surface to allow a greater degree of control over substrate temperature. This control may be further enhanced by using a heat transfer gas for thermal coupling between the chuck and substrate.

Various processes used in the fabrication of integrated circuits may include high temperatures and wide temperature ranges for substrate processing. Such temperatures may range from approximately 20° C. to approximately 150° C., and possibly as high as 300° C. to 500° C. or higher for some processes. It is therefore often desirable to have an electrostatic chuck operable over a wide range of temperatures.

To utilize the advantages of an electrostatic chuck, the electrostatic chuck may form part of a substrate support assembly including various components for heating and cooling the substrate and for routing power to the chuck electrodes. In addition, the substrate support assembly may also include components for providing a substrate bias and for providing plasma power. As a result, the ceramic body of the electrostatic chuck may include additional electrodes and other components, such as heating elements, gas channels, and coolant channels, to name a few. Also, the electrostatic chuck may be attached to one or more supporting components.

Figure 2:
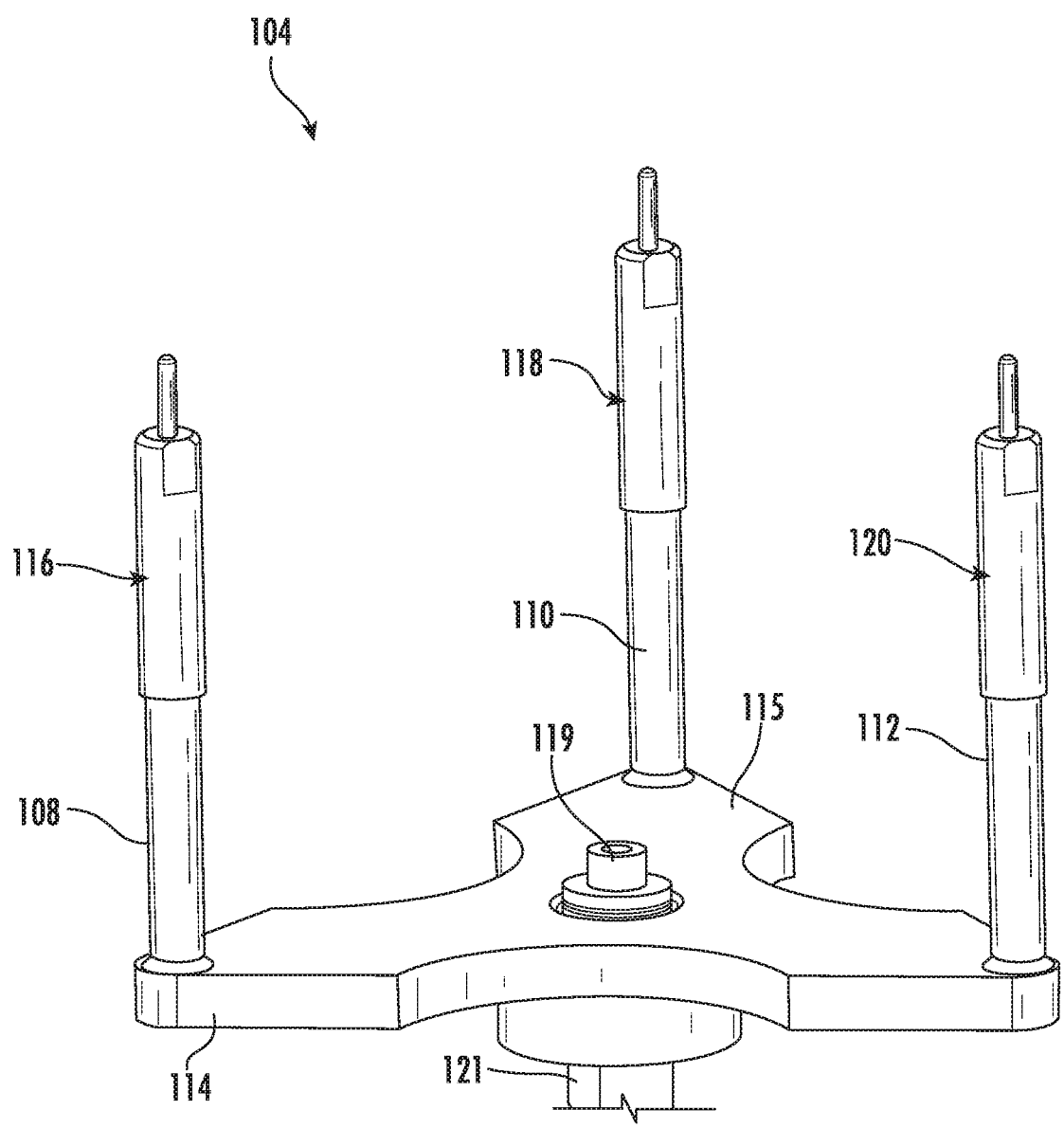
FIG. 2 shows a perspective view of a lift pin assembly of the lift pin system of FIG. 1 in accordance with certain aspects of the present disclosure.

Referring still to FIGS. 1-2, the lift pin assembly 104 of the system 100 may further include a support structure 106 including a plurality of support arms 108, 110, and 112 extending from a support base 114. As shown, the plurality of support arms 108, 110, and 112 extend into the wafer support 102, for example, through openings 123. Although not limited to any particular shape or configuration, the support base 114 may include three (3) points each including a corresponding support arm at an end thereof. In some embodiments, the plurality of support arms 108, 110, and 112 are integrally formed with the support base 114. The support base 114 may include a top surface 115 configured to abut or be positioned directly adjacent a bottom surface 117 of the wafer support 102 depending on the raised or lowered position of the lift pin assembly 104. The support base 114 may further include a fastener 119 coupling the support base 114 to a shaft 121. In some embodiments, the support base 114 may rotate around the shaft 121.

As further shown, connected to each of the plurality of support arms 108, 110, and 112 are respective pins 116, 118, and 120. In some embodiments, each of the plurality of pins 116, 118, and 120 may be directly physically coupled to each corresponding support arm 108, 110, and 112, e.g., by threading. Specifically, in some embodiments, internal threading along each of the plurality of pins 116, 118, and 120 is mechanically coupled to external threading along the exterior of respective support arms 108, 110, and 112.

Figure 3:
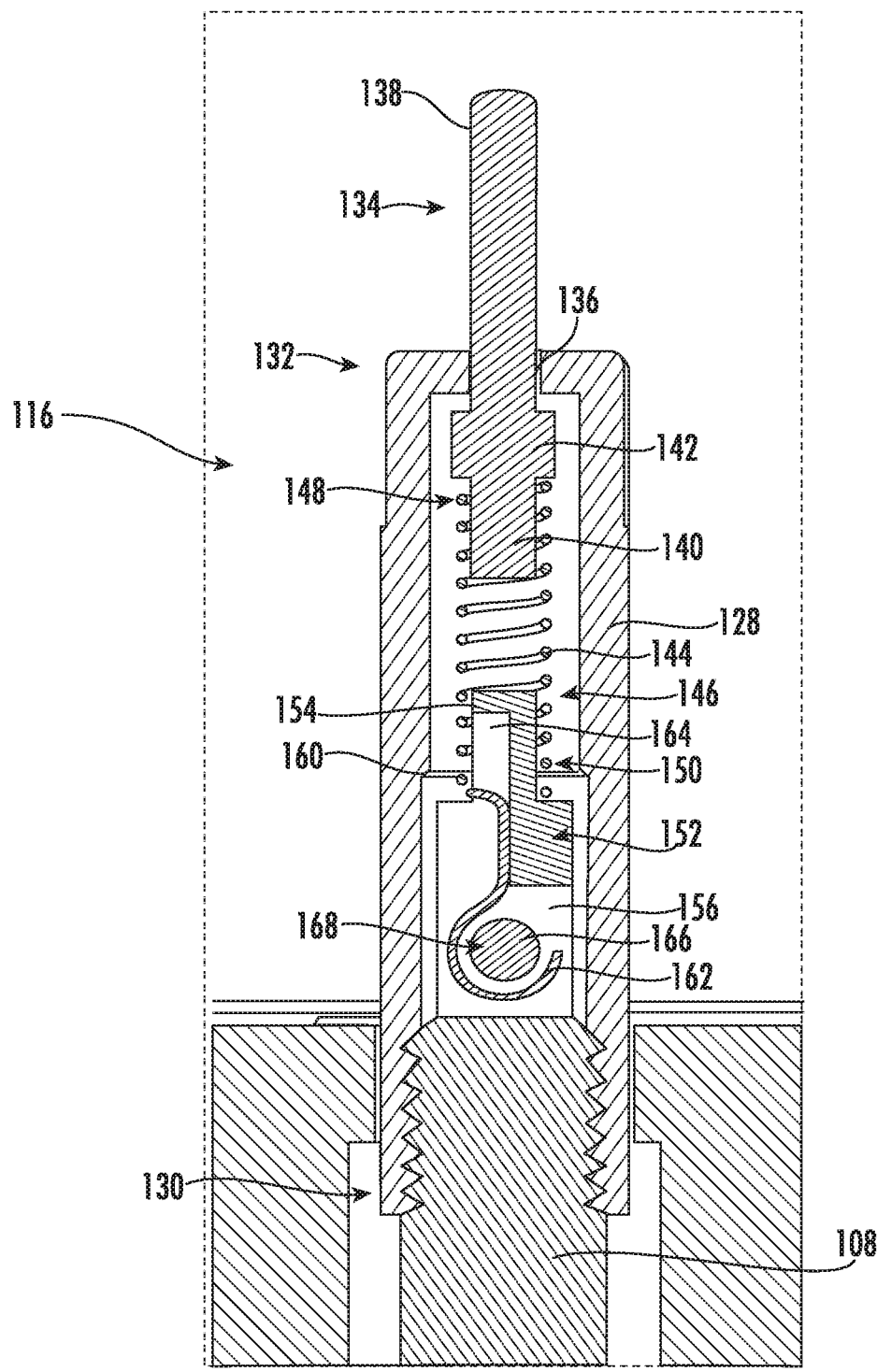
FIG. 3 shows a side cross-sectional view of a pin of the lift pin system of FIG. 1 in accordance with certain aspects of the present disclosure.
Figure 4:
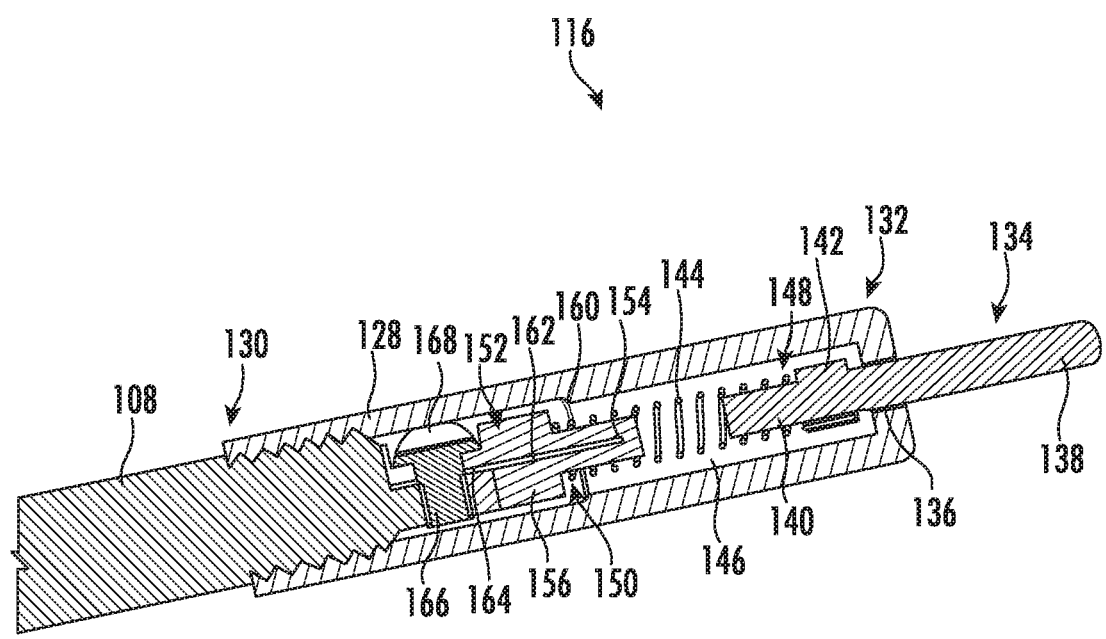
FIG. 4 shows another side cross-sectional view of a pin of the lift pin system of FIG. 1 in accordance with certain aspects of the present disclosure.

Turning now to FIGS. 3-4, an exemplary pin 116 of the lift pin assembly 104 according to non-limiting embodiments of the present disclosure will be described in greater detail. As shown, the pin 116 may include a housing 128 having a proximal end 130 and a distal end 132. A tip 134 may extend through an opening 136 in the distal end 132 of the housing 128. At the proximal end 130, the housing 128 may surround, and be directly mechanically coupled to, the support arm 108. In some embodiments, the tip 134 includes a first section 138 extending outside of the housing 128 for engagement with a wafer (not shown). The tip 134 may further include a second section 140, within the housing 128, the second section 140 including a flange 142 having a cross-section or diameter larger/longer than a diameter of the opening 136. As such, the flange 142 may restrict axial movement of the pin towards the distal end 132 of the housing 128.

As further shown, the pin 116 may include a spring 144 positioned within an interior 146 of the housing 128. In some embodiments, the spring 144 is a helical spring having a first end 148 surrounding the second section 140 of the tip 134 and is in abutment with the flange 142. In some embodiments, the spring 144 may be directly welded to the tip 134. A second end 150 of the spring 144 may be coupled to a base 152 positioned within the housing 128. For example, the base 152 may include a first portion 154 extending into the spring 144, towards the distal end 132 of the housing 128. The base 152 may further include a second portion 156, extending from the first portion 154, the second portion 156 having a larger cross-section than the first portion 154 for engagement with an internal shoulder 160 of the housing 128 to maintain an axial position of the base 152 within the interior 146 of the housing 128.

In some embodiments, the second end 150 of the spring 144 may be directly physically coupled to the base 152. For example, a bottom tang 162 of the spring 144 may extend within an internal channel 164 of the base 152, and extend around a stem 166 of a fastener 168, such as a screw. In some embodiments, the bottom tang 162 may be mechanically clamped by the fastener 168 and the base 152 to maintain electrical continuity and to secure the spring 144 in place during installation of the pin 116.

Figure 5:
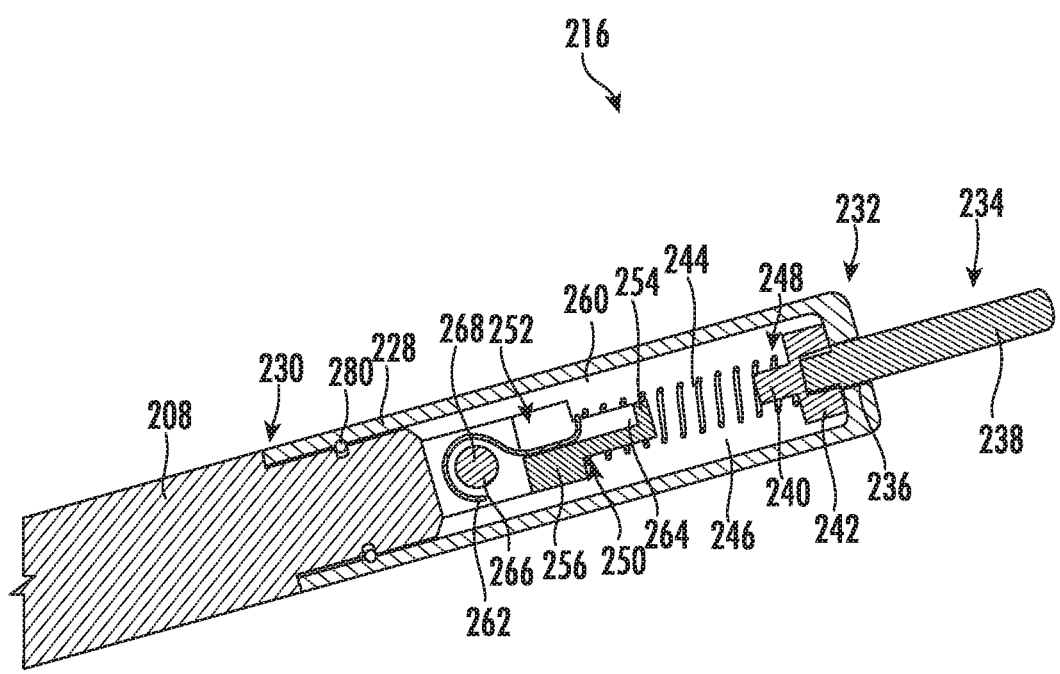
FIG. 5 shows a side cross-sectional view of another pin in accordance with certain aspects of the present disclosure.

Turning now to FIG. 5, another exemplary pin 216 of a pin assembly (e.g., lift pin assembly 104 of FIGS. 1-4) according to non-limiting embodiments of the present disclosure will be described in greater detail. As shown, the pin 216 may include a housing 228 having a proximal end 230 and a distal end 232. A tip 234 may extend through an opening 236 in the distal end 232 of the housing 228. At the proximal end 230, the housing 228 may surround, and be directly mechanically coupled to, the support arm 208. In this embodiment, the housing 228 may be press-fitted around the support arm 208, and include one or more O-rings 280 forming a friction seal between an inner surface of the housing 228 and an exterior surface of the support arm 208.

In some embodiments, the tip 234 includes a first section 238 extending outside of the housing 228 for engagement with a wafer (not shown). The tip 234 may further include a second section 240, within the housing 228, the second section 240 including a flange 242 having a cross-section or diameter larger/longer than a diameter of the opening 236. As such, the flange 242 may restrict axial movement of the pin towards the distal end 232 of the housing 228. In this embodiment, the first section 238 and the second section 240 may be separate components coupled together. Furthermore, in some embodiments, the first section 238 may be non-metallic/non-conductive. The first section 238 may be press-fitted into the second section 240, the second section 240 laser welded to the spring 244.

As further shown, the pin 216 may include a spring 244 positioned within an interior 246 of the housing 228. In some embodiments, the spring 244 is a helical spring having a first end 248 surrounding the second section 240 of the tip and is in abutment with the flange 242. A second end 250 of the spring 244 may be coupled to a base 252 positioned within the housing 228. For example, the base 252 may include a first portion 254 extending into the spring 244, towards the distal end 232 of the housing 228. The base 252 may further include a second portion 256, extending from the first portion 254, the second portion 256 having a larger cross-section than the first portion 254 for engagement with an internal shoulder 260 of the housing 228 to maintain an axial position of the base 252 within the interior 246 of the housing 228.

In some embodiments, the second end 250 of the spring 244 may be directly physically coupled to the base 252. For example, a bottom tang 262 of the spring 244 may extend within an internal channel 264 of the base 252, and extend around a stem 266 of a fastener 268, such as a screw. In some embodiments, the bottom tang 262 may be mechanically clamped by the fastener 268 and the base 252 to maintain electrical continuity and to secure the spring 244 in place during installation of the pin 216.

Figure 6:
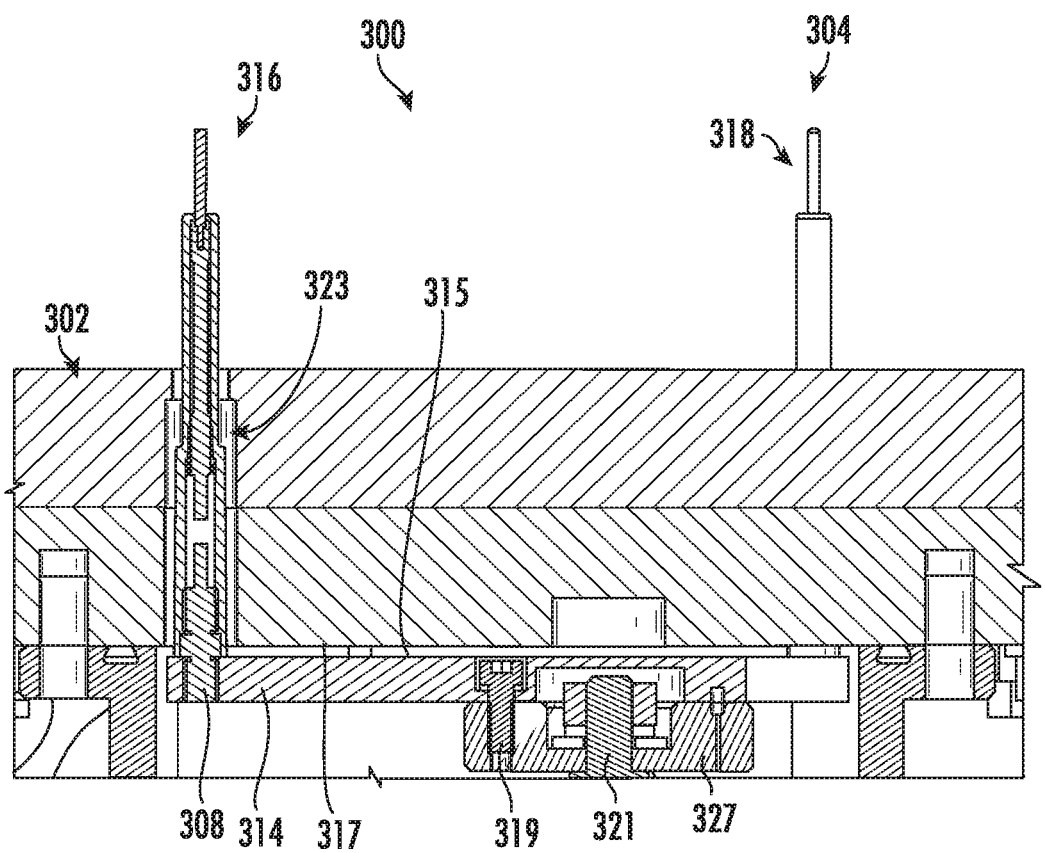
FIG. 6 shows a side cross-sectional view of a lift pin system in accordance with certain aspects of the present disclosure.
Figure 7:
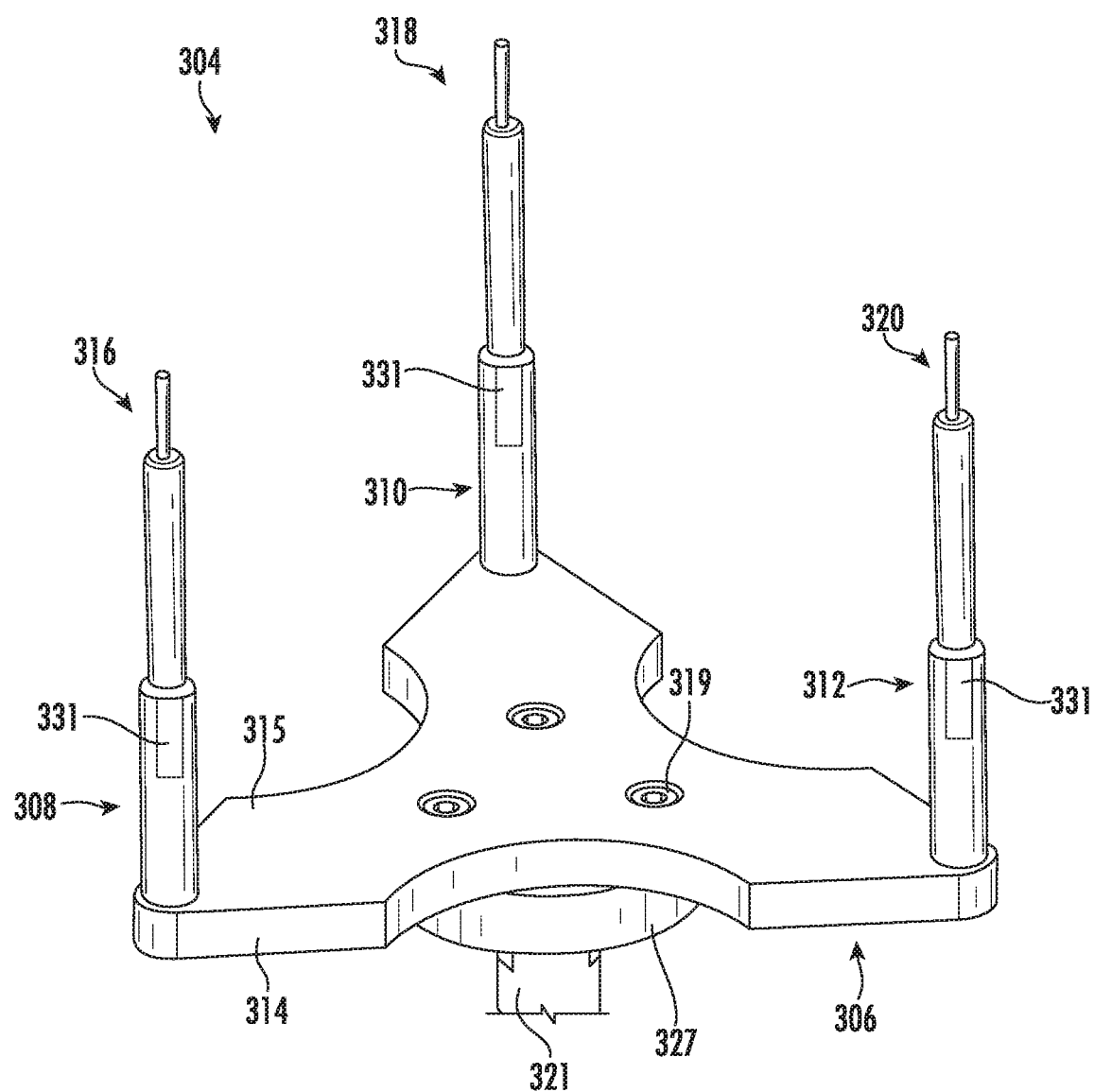
FIG. 7 shows a perspective view of a lift pin assembly of the lift pin system of FIG. 6 in accordance with certain aspects of the present disclosure.

With reference now to FIGS. 6-7, a lift pin system (hereinafter "system") 300 according to embodiments of the present disclosure will be described in greater detail. As shown, the system 300 may include a wafer support 302, and a lift pin assembly 304 coupled to the wafer support 302. Although not limited to any particular type or geometry, the wafer support 302 may be an electrostatic chuck used to hold a substrate, such as a semiconductor wafer or a platen.

The lift pin assembly 304 of the system 300 may further include a support structure 306 including a plurality of support arms 308, 310, and 312 extending from a support base 314. As shown, the plurality of support arms 308, 310, and 312 extend into the wafer support 302, for example, through a set of openings 323. Although not limited to any particular shape or configuration, the support base 314 may include three (3) points each including a corresponding support arm at an end thereof. The support base 314 may include a top surface 315 configured to abut or be positioned directly adjacent a bottom surface 317 of the wafer support 302 depending on the raised or lowered position of the lift pin assembly 304. The support base 314 may further include a plurality of fasteners (e.g., screws) 319 coupling the support base 314 to a pedestal 327 and shaft 321. In some embodiments, the support base 314 may rotate around the shaft 321.

As further shown, connected to each of the plurality of support arms 308, 310, and 312 are respective pins 316, 318, and 320. In some embodiments, each of the plurality of pins 316, 318, and 320 may be directly physically/mechanically coupled to each corresponding support arm 308, 310, and 312, e.g., by threading or by press-fit. Specifically, in some embodiments, internal threading along each of the plurality of pins 316, 318, and 320 is mechanically coupled to external threading along the exterior of respective support arms 308, 310, and 312. As best shown in FIG. 7, each of the plurality of pins 316, 318, and 320 may include one or more tooling flats 331 to enable removal from the support base 314.

Figure 8:
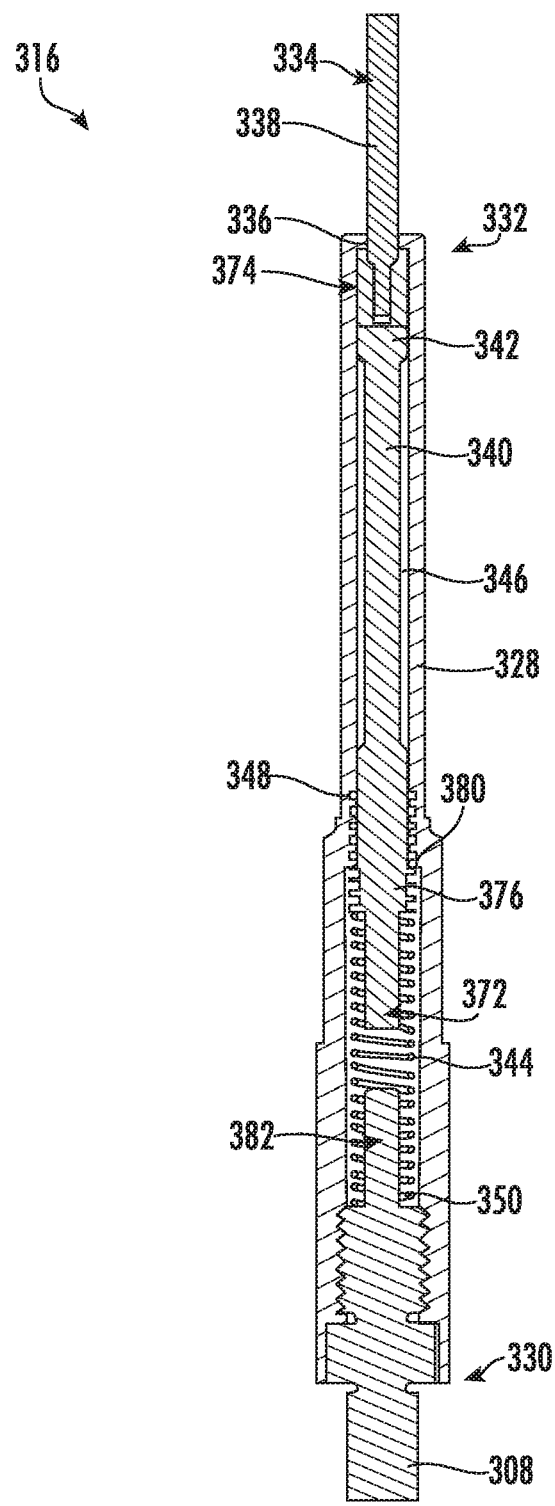
FIG. 8 shows a side cross-sectional view of a pin of the lift pin system of FIG. 6 in accordance with certain aspects of the present disclosure.

Turning now to FIG. 8, an exemplary pin 316 of the lift pin assembly 304 according to non-limiting embodiments of the present disclosure will be described in greater detail. As shown, the pin 316 may include a housing 328 having a proximal end 330 and a distal end 332. In some embodiments, the proximal end 330 may extend to the top surface 315 of the support base 314 (FIGS. 6-7). A tip 334 may extend through an opening 336 in the distal end 332 of the housing 328. At the proximal end 330, the housing 328 may surround, and be directly mechanically coupled to, the support arm 308. In some embodiments, the tip 334 includes a first section 338 extending outside of the housing 328 for engagement with a wafer (not shown). The tip 334 may further include a second section 340, within the housing 328, the second section 340 including a flange 342 having a cross-section or diameter larger/longer than a diameter of the opening 336. As such, the flange 342 may prevent the tip 334 from exiting the distal end 332 of the housing 328. In some embodiments, the first section 338 may be press-fitted into the second section 340. As shown, the second section 340 may be a shaft extending through an interior 346 of the housing 328. The second section 340 may have a proximate end 372 proximate the support arm 308, and a distal end 374 extending to the distal end 332 of the housing 328. The second section 340 may include a second flange 376 in abutment with an internal shoulder 380 to restrict movement of the pin 316.

As further shown, the pin 316 may include a spring 344 positioned within the interior 346 of the housing 328. In some embodiments, the spring 344 is a helical spring having a first end 348 surrounding the second section 340 of the tip 334 and is in abutment with the second flange 376. In some embodiments, the spring 344 may be directly welded to the second section 340 of the tip 334. A second end 350 of the spring 344 may abut the support arm 308 extending into the housing 328. In some embodiments, the support arm 308 may include a support stem 382 extending upwardly into the second end 350 of the spring 344.

In some embodiments, the second end 350 of the spring 344 may be directly physically coupled to the support arm 308. Although not specifically shown, a bottom tang of the spring 344 may extend within an internal channel of the support arm 308. The bottom tang of the spring 344 may be mechanically clamped or otherwise retained therein bto ensure electrical continuity. The pin 316 may be press-fit and threaded into place for use in the field, making the pin 316 essentially an inseparable assembly.

A first advantage of the embodiments herein includes the ease of replacing the pin tips because the pin tips can be replaced above the electrostatic chuck surface during regular processing, thus reducing down time. A second advantage of the embodiments herein is the ability to use different lift pins for different processes/species, different devices/wafers (backside layers) and temperature ranges. Lift pins can be customized for the process, user, product line, etc. A third advantage of the embodiments herein includes improved defocusing, i.e., more repeatable and easier to replace lift pins. A fourth advantage of the embodiments herein includes reduction in de-chucking issues by providing custom materials and lift pin forces.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

The invention claimed is:

1. A lift pin system, comprising:
a wafer support; and
a lift pin assembly coupled to the wafer support, the lift pin assembly including a plurality of pins, each of the plurality of pins comprising:
a tip extending through a housing,
wherein the housing extends entirely through the wafer support; and
a spring within the housing, the spring biasing against the tip.

2. The pin lift system of claim 1, wherein the tip and the housing extend above a top surface of the wafer support.

3. The pin lift system of claim 1, further comprising a support arm threadably coupled to the housing.

4. The lift pin system of claim 1, further comprising a support base of a support structure, the housing extending from a top surface of the support base.

5. The lift pin system of claim 1, wherein the tip comprises:
a first section extending through an opening of the housing; and
a second section extending from the first section, the second section positioned within the housing.

6. The lift pin system of claim 5, wherein the second section includes a flange, and wherein a first end of the spring is in abutment with the flange.

7. The lift pin system of claim 6, wherein the first end of the spring extends around the second section of the tip.

8. The lift pin system of claim 5, further comprising a support arm within the housing, wherein a second end of the spring is in direct abutment with the support arm.

9. The lift pin system of claim 8, the support arm comprising a support stem extending into the second end of the spring.

10. A lift pin assembly, comprising:
 a support structure including a plurality of support arms extending through an electrostatic chuck;
 a housing and a tip within the housing, wherein the housing extends entirely through the electrostatic chuck; and
 a spring within the housing, the spring biasing against the tip.

11. The lift pin assembly of claim 10, wherein the tip and the housing extend above a top surface of the electrostatic chuck.

12. The lift pin assembly of claim 10, wherein the further comprising a plurality of support arms is directly threadably coupled with the housing.

13. The lift pin assembly of claim 10, wherein the tip comprises:
 a first section extending through an opening at a distal end of the housing; and
 a second section extending from the first section, the second section positioned within the housing, wherein the second section includes a flange adjacent an inner surface of the distal end of the housing.

14. The lift pin assembly of claim 13, wherein the first end of the spring extends around the second section of the tip.

15. The lift pin assembly of claim 13, further comprising a support arm within the housing, wherein a second end of the spring directly contacts the support arm.

16. The lift pin assembly of claim 15, wherein the second end of the spring wraps around a support stem of the support arm, the support arm disposed within the housing.

17. A system, comprising:
 a process chamber;
 a lift pin assembly within the process chamber, the lift pin assembly comprising:
  a support structure including a plurality of support arms coupled to an electrostatic chuck;
  a housing coupled to each of the plurality of support arms;
  a tip extending through the housing, wherein the tip and the housing extend above a top surface of the electrostatic chuck; and
  a spring within the housing, the spring biasing against the tip.

* * * * *